United States Patent [19]

Bodas et al.

[11] Patent Number: 5,436,584
[45] Date of Patent: Jul. 25, 1995

[54] NOISE SUPPRESSING CIRCUIT FOR VLSI

[75] Inventors: Milind A. Bodas, Sunnyvale; Nagaraj Palasamudram; Lavi Lev, both of San Jose, all of Calif.

[73] Assignee: Intel Corporation, Santa Clara, Calif.

[21] Appl. No.: 152,730

[22] Filed: Nov. 15, 1993

[51] Int. Cl.[6] ......................................... H03K 17/687
[52] U.S. Cl. .................... 327/310; 327/373; 327/391; 327/379
[58] Field of Search .............. 307/542, 546, 547, 548, 307/550, 568, 572, 443, 579

[56] References Cited

U.S. PATENT DOCUMENTS

| | | | |
|---|---|---|---|
| 4,779,013 | 10/1988 | Tanaka | 307/443 |
| 5,128,555 | 7/1992 | Millman | 307/263 |
| 5,321,314 | 6/1994 | Slemmer | 307/603 |

*Primary Examiner*—Timothy P. Callahan
*Assistant Examiner*—Eunja Shin

*Attorney, Agent, or Firm*—Blakely, Sokoloff, Taylor & Zafman

[57] ABSTRACT

A noise suppression circuit for a floating bus in a digital integrated circuit includes pull-up and pull-down feedback loops each connected to the floating bus. The pull-up feedback loop includes a PMOS device connected between a high logic level and the floating bus, with a NOR gate switching the PMOS device. The pull-down feedback loop includes an NMOS device connected between a low logic level and the floating bus, with a NAND gate switches the NMOS device. The NOR and NAND gates are configured such that one of their inputs is connected directly to the floating bus and the other input is connected to the floating bus through an inverter having a finite gate delay. Voltage transitions occurring on the floating bus due to noise injection drive the bus back to its original state before the finite gate delay of the inverter.

2 Claims, 2 Drawing Sheets

FIG_1
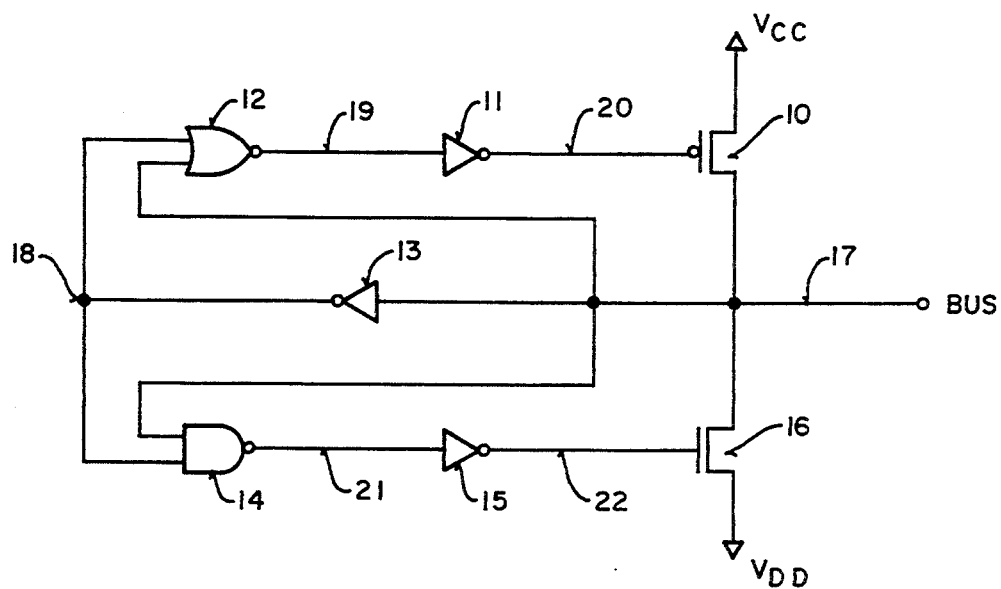
FIG_2
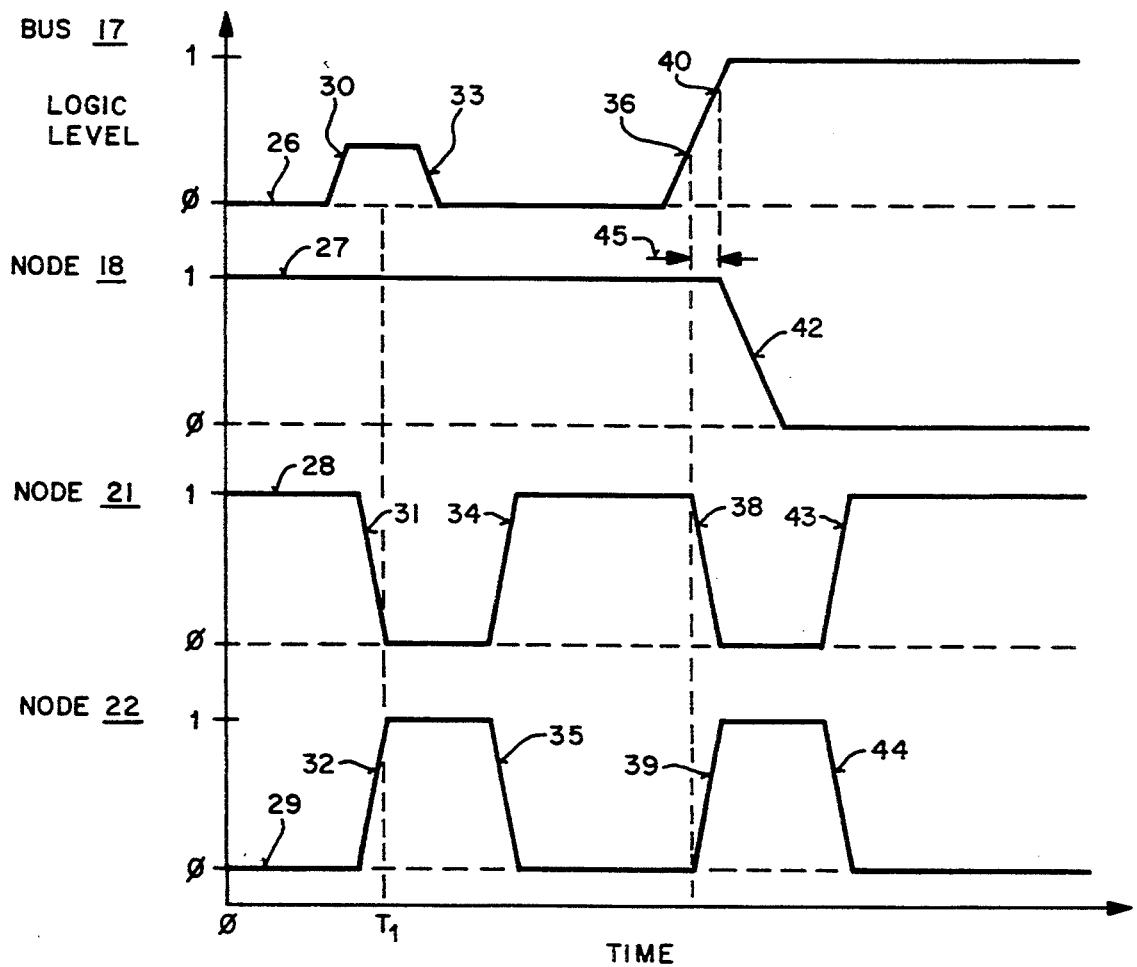

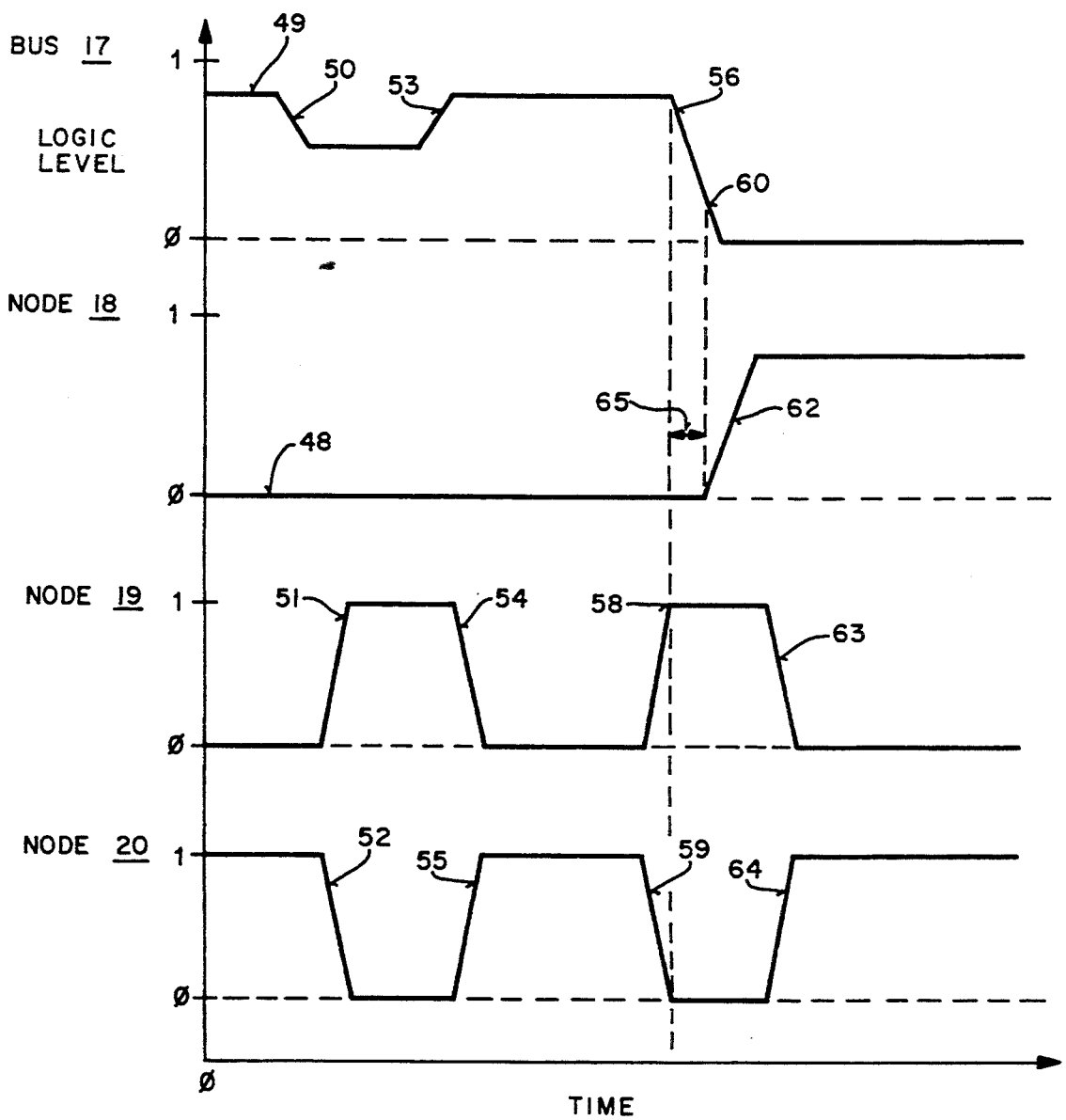

NOISE SUPPRESSING CIRCUIT FOR VLSI

FIELD OF THE INVENTION

The present invention relates to the field of circuit design, and particularly to noise suppression in digital integrated circuit designs.

BACKGROUND OF THE INVENTION

In digital integrated circuit (IC) technology, there is a drive for reduction of size. However, as the size of the IC shrinks, signal lines may be placed very close to each. As the space between lines decreases, they begin to interact due to parasitic capacitances. Consequently, the lines do not behave as independent signal carriers.

For example, a signal line situated between two other lines has several associated parasitic capacitance. It first has it own self capacitance between the substrate and itself. In addition, there is a coupling capacitance between the center line and each of the adjacent lines. If the center line is floating, i.e. the charge on the line is stored on the line's capacitance, then changes on either or both of the adjacent lines will cause noise to be injected into the middle line. The amount of noise is linearly dependent on the value of coupling capacitance, which in turn is inversely dependent on the space between the lines. Therefore as digital ICs become more dense and lines are placed closer to each other noise injection problems intensify.

One type of bus in digital circuits that is particularly sensitive to capacitive coupling noise is frequently referred to as a tri-state bus. In general, a tri-state bus is a bus that is driven by one or more tri-state drivers. Only one of the drivers is selectively enabled to drive the bus. Once the tri-state bus is charged to a certain logic level, the selected driver is disabled. Thus, the tri-state bus is floating and may be sampled by other logic circuits within the digital circuit. Since the bus is floating, (i.e. not continuously driven by any other circuitry), it is more susceptible to noise. For this reason tri-state buses are connected to leakers.

Leakers provide noise suppression for the tri-state bus. A typical leaker is comprised of two inverters having their inputs connected to the others output. In addition, an input of one of the inverters is connected to the tri-state bus. The magnitude of high or low voltage fluctuations due to noise that the leaker can tolerate is determined by its "trip" point. The "trip" point of the leaker is approximately equal to half of the voltage swing between the high and low voltage level of its associated logic signal. Consequently, the leaker can tolerate voltage fluctuations that are less than half of it associated voltage swing.

For example, if a negative voltage fluctuation (having a magnitude of less than the leaker's trip point) occurs on a tri-state bus which is charged to a high voltage level, the leaker functions to drive the tri-state bus back to the high voltage level. However, if the voltage fluctuation is of a large enough magnitude, it may cause the leaker to change states, i.e. drive the tri-state bus from one logic level to another. And, if the tri-state bus is sampled by another circuit, erroneous data would be transferred.

Thus, the noise suppression capability of the leaker is limited to a noise margin. Further, when buses are placed very close together, as is typical in current digital integrated circuit designs, the magnitude of noise generated by the capacitive coupling effects increases. As a result, the leaker becomes even more ineffective.

The circuit of the present invention provides superior noise suppression in comparison to the leaker as described above. It is capable of differentiating between voltage transitions resulting from noise and intentional voltage transitions generated by the tri-state drivers. In addition, the noise suppression circuit of the present invention is not limited by the magnitude of the noise.

SUMMARY OF THE INVENTION

A circuit for reducing noise on buses is described. The noise suppression circuit of the present invention functions such that it senses and resists changes due to noise in the voltage level on the bus. To do this the circuit of the present invention differentiates between an intentional change, (i.e. voltage transitions due to a logic gate driving the bus to a high or low level voltage) and an undesired change, (i.e. voltage fluctuations due to capacitive coupling).

The bus is coupled to the input of a first inverter of the present invention. The first inverter has a finite gate delay. The output of the first inverter is coupled to one input of a NAND logic gate and one input of a NOR gate. The other input of each of the NAND and NOR logic gates is coupled directly to the bus. Thus, there is a a finite delay between the time the first input senses a change on the bus and the second input senses a change on the bus. The output of the NAND gate is coupled to the gate of an n-channel device through a second inverter. Similarly, the output of the NOR gate is coupled to the gate of a p-channel device through a third inverter.

The source and drain of the p-channel device are coupled between the bus and a voltage source corresponding to a high logic level. When the gate of the p-channel device is low, it pulls the bus to a voltage corresponding to the high logic level. Similarly, the source and drain of the n-channel device are coupled between the bus and a voltage source corresponding to a low logic level. As a result, when the n-channel device is on, it drives the bus to a low logic level. The NOR and NAND gate output signals provide the control signal to the p-channel and n-channel devices, respectively.

If a voltage transition occurs on the bus either due to capacitive coupling noise or an intentional voltage transition, the one of the input signals coupled to the NAND or NOR gates will not change because of the gate delay of the first inverter. This causes either the NAND or NOR gates to enable their corresponding p-channel or n-channel device. The p-channel or n-channel device begins to drive the bus in the opposite direction of the voltage transition. All of this occurs until the initial transition propagates through the first inverter.

If the voltage transition on the bus originated from noise generated from an adjacent line, once the transition on the adjacent line is over, the driving source of the noise is no longer present. Therefore, the bus is easily driven back to its original state by the above-described mechanism. Thus, if the transition originated from capacitive coupling noise, the bus is driven back to its original state, before the transition propagates through the first inverter. Once the bus is driven back to its original state, the two inputs of the NAND and NOR gates are different and consequently the p-channel or n-channel device is disabled.

However, if the voltage transition on the bus is intentional, then the driving source is an enabled tri-state driver. Therefore, it will still be driving the bus by the time the output of the first inverter changes state. Thus, during the inverter delay, the noise suppression circuit of the present invention begins to drive the bus in the opposite direction of the intentional transition by enabling either the n-channel or p-channel device. However, since the source of the voltage transition originates from an enabled tri-state driver, the bus resists the effects of the the p-channel or n-channel device. As a result, after the inverter delay, the input of the NAND and NOR gates are different and the n-channel or p-channel device is disabled.

To enhance the quick reaction of the noise suppression circuit, in one embodiment of the present invention the NAND gate is designed such that it has a fast high-to-low output transition and the NOR gate is designed to have a fast low-to-high output transition. Quick responses by the logic gates further enhances the performance of the noise suppression circuit of the present invention at high frequencies.

BRIEF DESCRIPTION OF THE DRAWINGS

FIG. I illustrates the noise suppression circuit of the present invention.

FIG. 2 is a diagram showing the effect of an intentional positive voltage transition and a positive voltage transition due to noise on certain nodes within the noise suppression circuit of the present invention.

FIG. 3 is a diagram showing the effect of an intentional negative voltage transition and a negative voltage transition due to noise on certain nodes within the noise suppression circuit of the present invention.

DETAILED DESCRIPTION

A noise suppression circuit for digital integrated circuitry is described. In the following description, numerous specific details are set forth in order to provide a thorough understanding of the present invention. It will be obvious, however, to one skilled in the art that these specific details need not be employed to practice the present invention. In other instances, well-known logic gates are not described in detail in order avoid unnecessarily obscure the present invention.

FIG. 1 shows the noise suppression circuit of the present invention. Bus 17 functions as a tri-state bus and typically is charged by an enabled tri-state driver which is located somewhere else in the circuit. After bus 17 is charged to a certain logic level the tri-state driver is disabled and bus 17 is left floating.

As shown in FIG. 1, bus 17 is connected to a first input of NAND gate 14 and NOR gate 12. Thus, all voltage transitions (intentional or noise related) on bus 17 are immediately detected by the NAND and NOR gates. The second inputs of NAND gate 14 and NOR gate 12 are connected to the output of inverter 13, (node 18). The input of inverter 13 is connected to bus 17. Consequently, the signal on the second input of NAND gate 14 and NOR gate 12 is the inverse of the signal on the first input.

FIG. 1 also shows the output of NAND gate 14 being connected to the gate of n-channel device 16 through inverter 15. Thus, the output signal of NAND gate 14 controls n-channel device 16. N-channel device 16 is connected between bus 17 and a first working voltage potential, $V_{DD}$. The magnitude of $V_{DD}$ corresponds to the low logic level of the signal coupled to bus 17.

N-channel device 16 functions as a pull-down device such that when the gate of device 16 is high, it tries to pull bus 17 to a voltage potential equal to $V_{DD}$. The input signal on the gate of device 16 is high only when the output of NAND gate 14 is low. This occurs only when both inputs of NAND gate 14 are high.

Similar to NAND gate 14, NOR gate 12 controls p-channel device 10. NOR gate 12 is connected to p-channel device 10 through inverter 11. P-channel device 10 is connected between bus 17 and a second working voltage potential, $V_{CC}$. The magnitude of $V_{CC}$ corresponds to the high logic level of the signal coupled to bus 17. Thus, when the input of device 10 is low, it will pull bus 17 to a voltage potential equal to $V_{CC}$. The input signal on the gate of device 10 is low only when the output of NOR gate 12 is high. This occurs only when both inputs of NOR gate 12 are low.

When there are no voltage transitions on bus 17, the noise suppression circuit is stable. In the stable state, if bus 17 is charged to one logic level then the voltage signal on line 18 will be the inverse of that logic level. Therefore, the inputs of both the NAND and NOR gates will be at different logic levels. When the inputs to NAND gate 14 are different, its output is high. Since the input signal to device 16 is the inverse of NAND gate 14's output signal, device 16's gate is at a low voltage and is deactivated. Thus, when bus 17 is stable, device 16 does not drive bus 17 to $V_{DD}$.

In contrast to the operation of a NAND gate, when the inputs to NOR gate 12 are at different logic levels, its output is low. Therefore, when bus 17 is stable the output of NOR gate 12 is low. Since the voltage signal on the gate of device 10 is the inverse of the output of NOR gate 12, device 10 is also disabled when bus 17 is stable. Thus, when no transitions are occurring on bus 17, (i.e. charged to either a high or low level), devices 10 and 16 are both disabled.

Referring to FIGS. 2, lines 26-29 show the state of bus 17, node 18, the output of NAND gate 14 (node 21), and the output of inverter 15 (node 22) when the circuit is stable and bus 17 is at a low logic level. As can be seen, when bus 17 is at a logic low level (indicated by line 26) the signal on line 18 is at a logic high level (indicated by line 27). As described above, when both of the inputs of the NAND and NOR gates are different, (i.e. in a stable state) their outputs are high and low, respectively. FIG. 2 shows the output of NAND gate 14 (node 21) at a high logic level, (indicated by line 28). Since node 22 in FIG. 1 is the inverse of node 21, node 22 is at a low logic level, (as shown by line 29 in FIG. 2).

FIG. 2 shows the two types of low-to-high voltage transitions that may occur on bus 17. The voltage transition indicated by line 30 is caused by capacitive coupling noise. The transition indicated by lines 36 and 40 represent intentional voltage transitions generated from a driving gate.

As indicated above, before any voltage transitions occur, the inputs to both of the NAND and NOR gates are different, i.e. in the stable state. As shown in FIG. 2, when bus 17 begins to transition low-to-high, (line 30), due to noise generated by adjacent lines, node 18 does not reflect the change immediately. This is due to the gate delay of inverter 13. Therefore, even though the noise on bus 17 may be high enough to drive inverter 13 low, the output of inverter 18 remains high. Thus, the two inputs to NAND gate 14 and NOR gate 12, (node 18 and bus 17) are high at $T_1$. As can be seen in FIG. 2, line 27 shows node 18 being high while bus 17 is also at a high level. Although, the high logic level shown in FIG. 2 for bus 17 at time T₁ is not at the maximum logic swing level for a logic high, it is still at a level high enough to switch logic gates 12 and 14.

When both of the inputs of NOR gate 12 are high, the gate of PMOS device 10 is also high and is deactivated. As can be seen, when low-to-high voltage transitions occur, the pull-up portion of the noise suppression circuit including NOR gate 12, inverter 11 and PMOS device 10 have no effect on the output bus'logic level.

However, when both of the inputs of NAND gate 14 are high, a different situation occurs. As can be seen in FIG. 2, the output of NAND gate 14 is initially high (line 28) when its inputs are at different states. When bus 17 transitions to a high state (or close to a high state) and both of the inputs of NAND gate 14 are high, its output goes low, (as indicated by line 31 FIG. 2). In response to the high-to-low transition on node 21, the output of inverter 15 (node 22) transitions low-to-high, as indicated by line 32 in FIG. 2. When node 22 is high pull-down device 16 is turned on and drives bus 17 to VDD, i.e. a logic low level. This can be seen in FIG. 2 as shown by line 33. It should be noted that bus 17 is driven to the logic low level before the gate delay of inverter 13. As indicated by line 27 shown in FIG. 2, the output of inverter 13, (node 18), remains high.

The main reason for this is that noise generated on a floating bus, such as bus 17, generally originates from capacitive coupling between adjacent transitioning lines. Thus, when an adjacent line transitions it capacitively drives bus 17 to either a high or low level. However once the adjacent line has finished transitioning, it is no longer driving bus 17. Since there is nothing driving bus 17 to the logic high level (such as a bus driver), bus 17 is quickly driven back to the low logic level by device 16. In fact, bus 17 is restored to its original state before the gate delay of inverter 13.

The noise suppression circuit in FIG. 1 responds in a similar manner when an intentional low-to-high voltage transition occurs. However, it does not suppress the intentional transitions. FIG. 2 shows an intentional voltage transition on bus 17 indicated by lines 36 and 40. The noise suppression circuit responds by initially activating pull-down device 16 as it did for the low-to-high noise transition. As shown in FIG. 2, when bus 17 reaches a level high enough (line 36) to trigger NAND gate 14, the output of NAND gate 14 is driven low (line 38) while the output of inverter 15 is driven high (line 39). As a result, NMOS device 16 turns on and tries to drive bus 17 low. This all occurs before the gate delay of inverter 13.

However, unlike the first case in which bus 17 is driven by capacitive noise, an intentional voltage transition is generated by a bus driver. This means that the driving source trying to cause bus 17 to transition is still there, unlike a noise generated transition. As a result, bus 17 can not be driven to VDD as in the case of a noise generated transition. Therefore, bus 17 continues to be driven high even after the gate delay of inverter 13, indicated by line 40 FIG. 2; (the gate delay of inverter 13 is indicated by line 45 in FIG. 2). After the gate delay of inverter 13, node 18 transitions high-to-low, indicated by line 42. When this occurs, the two inputs of NAND gate 14 are different and and the output of NAND gate 14 changes state; i.e. its output makes a low to high transition as indicated by line 43, FIG. 2. Further, inverter 15 also changes states and its output goes low, as indicated by line 44, FIG. 2. This deactivates pull-down device 16.

As can be seen, the noise suppression circuit is able to differentiate between an intentional voltage transition and an unintentional voltage transition and react accordingly.

The pull-up portion of the noise suppression circuit including NOR gate 12, inverter 11 and PMOS device 10 behaves in the same manner as the pull-down portion. For instance, when a high-to-low transition occurs, the pull-down portion of the circuit is deactivated since the two inputs of the NAND gate are both low. At the same time, but before the gate delay of inverter 13, NOR gate 19 and inverter 11 cause PMOS device 10 to drive bus 17 to VCC, i.e. a high level. In the case where the transition is generated by capacitive coupling, bus 17 is quickly driven back to its original state, i.e. high, before inverter 13's gate delay. In contrast, in the case where the high-to-low transition is intentional, pull-up device 10 tries to drive bus 17 to a high level but is unable to before inverter 13's gate delay. As a result, device 10 is deactivated.

FIG. 3 shows the effects of unintentional and intentional high-to-low voltage transitions on bus 17 on key nodes within the noise suppression circuit of the present invention. The noise suppression circuit is stable when bus 17 is high, indicated by line 49. Line 50 shows a noise related high-to-low voltage transition on bus 17. NOR gate 12 responds by transitioning low-to-high, (indicated by line 51 ), causing inverter 11 to change state, line 52. This activates PMOS device 10 which drives bus 17 back to its original high state, indicated by line 53. The output of inverter 13 (node 18) remains unaffected as indicated by line 48.

FIG. 3 shows an intentional high-to-low voltage transition occurring on bus 17 indicated by line 56 and 60. At a time before inverter 13's gate delay, indicated by line 56, the noise suppression circuit behaves in the same manner as with a noise related high-to-low transition by trying to drive bus 17 back to a high logic level. Thus, the output of NOR gate 12 transitions, (indicated by line 58), and the output of inverter 11 transitions, (indicated by line 59). As shown in FIG. 3, at a time after the gate delay of inverter 13, (indicated by interval 65 and line 60), node 18 transitions. The transition of node 18 is shown in FIG. 3 by line 62. This causes both of the outputs of NOR gate 12 and inverter 11 to transition (indicated by lines 63 and 64, respectively) which deactivates pull-up device 10.

In one embodiment of the present invention, logic gates 12 and 14 are made such that their outputs transition quickly in response to changes in their inputs. Specifically, NOR gate 12 is designed such that it has a fast high-to-low output transition. Similarly, NAND gate 14 is designed to have a fast low-to-high output transition. For example, if a low-to-high transition occurs on bus 17, the output of gate 14 reacts by changing from a high-to-low state. The speed at which the output of gate 14 transitions determines how quickly pull-down device 16 is activated and thus, how quickly noise on bus 17 is suppressed. As a result, the operation of the noise suppression circuit is enhanced, particularly when operated at high frequencies. Similarly, since NOR gate 12 needs to transition low-to-high to activate pull-up device 10 it is designed to have a quick low-to-high transition.

In the embodiment described above, the NAND gate is designed such that the output devices of the gate provide a less resistive path to VDD, (i.e. the logic low level) than the resistive path to VCC, (i.e. the high logic level). This is done by adjusting the device sizes of the NAND gate. As a result, the output of the NAND gate is able to transition faster from a high-to-low state that from a low-to-high state. Further, the NOR gate is designed such that the output devices of the gate provide a less resistive path to VCC than the path to VDD. Consequently, the NOR gate transitions quicker to a high state than to a low state.

We claim:

1. A circuit for suppressing noise on a bus carrying a signal driven between a high and a low voltage potential, said circuit comprising:

a first means for having an input coupled to said bus, an output, and associated gate delay;

second and third inverters, each having an input and an output;

a NAND gate having a first input coupled to said output of said first inverter and a second input coupled to said bus, an output of said NAND gate being coupled to said input of said second inverter;

a NOR gate having a first input coupled to said output of said first inverter and a second input coupled to said bus, an output of said NOR gate being coupled to said input of said third inverter;

a p-channel MOS device having a gate coupled to said output of said third inverter, a source coupled to said high voltage potential and a drain coupled to said bus, said p-channel MOS device driving said signal to said high voltage potential when enabled;

an n-channel MOS device transistor having a gate coupled to said output of said second inverter, a source coupled to said bus and a drain coupled to said low voltage potential said n-channel MOS device driving said signal to said low voltage potential when enabled;

said NAND gate controlling said n-channel MOS device such that when said signal transitions from said low voltage potential to said high voltage potential, said NAND gate causes said n-channel MOS device to be enabled and wherein, after said associated gate delay of said first inverter, if said signal is still at said high voltage potential, said NAND gate causing said n-channel MOS device to be disabled;

said NOR gate controlling said p-channel MOS device such that when said signal transitions form said high voltage potential to said low voltage potential, said NOR gate causes said p-channel MOS device to be enabled and wherein, after said associated gate delay of said first inverter, if said signal is still at said low voltage potential, said NOR gate causes said p-channel MOS device to be disabled.

2. The noise suppression circuit as described in claim 1 wherein said output of said NAND gate transitions from said high-to-low voltage potentials quicker than from said low-to-high voltage potentials, and wherein said output of said NOR gate transitions from said low-to-high voltage potentials quicker than from said high-to-low voltage potentials.

* * * * *

UNITED STATES PATENT AND TRADEMARK OFFICE
CERTIFICATE OF CORRECTION

PATENT NO. : 5,436,584
DATED : July 25, 1995
INVENTOR(S) : Bodas et al.

It is certified that error appears in the above-identified patent and that said Letters Patent is hereby corrected as shown below:

In column 7 at line 15 delete "means" and insert --inverter--

In column 7 at line 15 delete "for" after --inverter--

In column 8 at line 17 delete "form" and insert --from--

Signed and Sealed this

Seventeenth Day of September, 1996

*Attest:*

BRUCE LEHMAN

*Attesting Officer*                *Commissioner of Patents and Trademarks*